United States Patent
Zhang et al.

(10) Patent No.: US 7,570,684 B2
(45) Date of Patent: Aug. 4, 2009

(54) METHOD FOR JOINT TIME SYNCHRONIZATION AND FREQUENCY OFFSET ESTIMATION IN OFDM SYSTEM AND APPARATUS OF THE SAME

(75) Inventors: Zhongshan Zhang, Beijing (CN); Hidetoshi Kayama, Beijing (CN)

(73) Assignee: NTT Docomo, Inc., Tokyo (JP)

( * ) Notice: Subject to any disclaimer, the term of this patent is extended or adjusted under 35 U.S.C. 154(b) by 616 days.

(21) Appl. No.: 11/286,874

(22) Filed: Nov. 22, 2005

(65) Prior Publication Data

US 2006/0133526 A1 Jun. 22, 2006

(30) Foreign Application Priority Data

Nov. 25, 2004 (CN) .................... 2004 1 0009868

(51) Int. Cl.
- H04B 1/00 (2006.01)
- H04B 7/216 (2006.01)
- H04K 1/10 (2006.01)
- H03K 7/02 (2006.01)
- H04L 7/02 (2006.01)
- H04L 7/00 (2006.01)
- H04J 11/00 (2006.01)
- H04J 3/06 (2006.01)

(52) U.S. Cl. .................. 375/145; 375/260; 375/353; 375/354; 375/368; 375/371; 370/203; 370/320; 370/503

(58) Field of Classification Search .......... 375/260, 375/353, 354, 368, 371; 370/203, 320, 503
See application file for complete search history.

(56) References Cited

U.S. PATENT DOCUMENTS 5,687,165 A * 11/1997 Daffara et al. .............. 370/208

(Continued)

OTHER PUBLICATIONS

A new training symbol structure to enhance the performance of channel estimation for MIMO-OFDM systems Myeongcheol Shin; Hakju Lee; Chungyong Lee; Dae Hee Youn; Acoustics, Speech, and Signal Processing, 2003. Proceedings. (ICASSP '03). 2003 IEEE International Conference on vol. 4, Apr. 6-10, 2003 pp. IV-397-IV-400 vol. 4.*

(Continued)

Primary Examiner—Mohammad H Ghayour
Assistant Examiner—Sarah Hassan
(74) Attorney, Agent, or Firm—Blakely, Sokoloff, Taylor & Zafman LLP

(57) ABSTRACT

Embodiments of the present invention include a method for performing joint time synchronization and carrier frequency offset estimation in a wireless communication system, comprising steps of: on a transmitter: performing frequency domain spreading and interleaving on input data by using a predetermined spreading factor (SF) to generate a frequency domain training symbol; performing Inverse Discrete Fourier Transformation (IDFT) on the generated frequency domain training symbol to generate a first time domain training symbol; reversely copying the generated first time domain training symbol to a second time domain training symbol such that a complete training sequence is formed; and on a receiver: detecting an average power of received signals to judge the coming of a training sequence, and performing coarse frame synchronization; performing joint fine frame synchronization and carrier frequency offset estimation based on a received training sequence; and compensating for the carrier frequency offset based on the carrier frequency offset estimation result so as to eliminate the carrier frequency offset. In addition, embodiments of the present invention also include an apparatus for performing joint time synchronization and carrier frequency offset estimation and a method for generating a training sequence.

21 Claims, 11 Drawing Sheets

U.S. PATENT DOCUMENTS

| | | | |
|---|---|---|---|
| 6,618,452 B1 * | 9/2003 | Huber et al. | 375/343 |
| 6,654,339 B1 * | 11/2003 | Bohnke et al. | 370/203 |
| 2004/0008616 A1 * | 1/2004 | Jung et al. | 370/203 |
| 2004/0028004 A1 * | 2/2004 | Hayashi et al. | 370/320 |
| 2004/0190560 A1 * | 9/2004 | Maltsev et al. | 370/503 |
| 2005/0152327 A1 * | 7/2005 | Erlich et al. | 370/343 |
| 2006/0045169 A1 * | 3/2006 | Kim | 375/144 |

OTHER PUBLICATIONS

Zhongshan Zhang, et al. "Frequency Offset Estimation with Fast Acquisition in OFDM System." IEEE Communications Letters, vol. 8., No. 3, Mar. 2004.

Zhongshan Zhang, et al. "Joint Frame Synchorization and Frequency Offset Estimation OFDM Systems." IEEE Transactions on Broadcasting, vol. 51., No. 3, Sep. 2005.

* cited by examiner

AVERAGE POWER $=\sigma_s^2$

1 SYMBOL LENGTH = N

AVERAGE POWER OF
NON-ZERO SAMPLES $=SF \times \sigma_s^2$

1 SYMBOL LENGTH = N

METHOD FOR JOINT TIME SYNCHRONIZATION AND FREQUENCY OFFSET ESTIMATION IN OFDM SYSTEM AND APPARATUS OF THE SAME

PRIORITY

The present patent application claims priority to and incorporates by reference the corresponding Chinese patent application serial no. 200410009868.4, titled, "Method for Joint Time Synchronization and Frequency Offset Estimation in OFDM System and Apparatus of the Same" filed on Nov. 25, 2004.

BACKGROUND OF THE INVENTION

1. Field of the Invention

The present invention relates to a method for performing joint time synchronization and frequency offset estimation in a high-speed wireless communication system and an apparatus, in particularly, to a method and an apparatus for performing joint time synchronization and frequency offset estimation in an Orthogonal Frequency Division Multiplexing (OFDM) wireless communication system. The method and apparatus can perform carrier frequency offset acquisition while performing accurate time synchronization, and have an effect of a large carrier frequency offset acquisition range and a high estimation accuracy.

2. Description of the Prior Art

In a high-speed wireless communication system, especially an Orthogonal Frequency Division Multiplexing (OFDM) wireless communication system, accurate and reliable time synchronization is essential so that a receiver can properly demodulate data transmitted by a transmitter. Meanwhile, since the OFDM system is very sensitive to carrier frequency offset, it is necessary for the receiver to provide an accurate and efficient algorithm to properly estimate and correct the carrier frequency offset. The receiver has to accurately locate the received data frames, and determine a beginning point and an ending point of each data frame.

However, due to various causes such as miss matching between the frequencies of the oscillators of the transmitter and receiver, Doppler frequency shift etc, frequency offset may occur between the transmitter and the receiver. Further, the frequency offset will also impact on the demodulation performance of the receiver. A conventional method in the existing synchronization system is to achieve time synchronization and frequency synchronization with the aid of a training sequence.

In the existing synchronization algorithms, some ones use a null symbol to perform synchronization location. That is, when the receiver detects a low voltage symbol, it assumes that a new symbol is coming. But this algorithm can only be used in a continuous transmission mode of broadcasting, and will fail in a burst transmission mode like in a wireless local area network. Since the burst transmission system may be in an idle state for a long time period, it cannot be distinguished whether the system is in an idle state or receives a null symbol. Some algorithms use a cyclic prefix in OFDM symbols to perform synchronization. However, this kind of algorithms can only perform symbol synchronization other than frame synchronization. In addition, this kind of algorithm has a lower accuracy due to the short length of common cyclic prefixes. Another kind of algorithm uses the training sequence to perform time synchronization and carrier frequency offset estimation, but the average power of the training sequence used by these conventional algorithms is the same as that of a general data symbol, and therefore it may result in a higher packet loss rate, especially in a condition of low signal-to-nose ratio. In general, also, many existing algorithms perform the time synchronization first and then perform the carrier frequency offset estimation. The disadvantages of this synchronization scheme are in that: since the time synchronization offset and the carrier frequency offset are not independent from each other but influenced, the condition of the carrier frequency offset estimation is that an accurate time synchronization has to be achieved by the receiver. However, the performance of the time synchronization is influenced by the carrier frequency offset. Since they are dependent on each other, individually processing the time synchronization and the carrier frequency offset will cause a large error, and even probably result in the failure of the algorithms.

SUMMARY OF THE INVENTION

In view of above problems, embodiments of the present invention includes a method and an apparatus for performing joint time synchronization and carrier frequency offset estimation with which the frame synchronization and carrier frequency offset acquisition can be performed simultaneously, reliable frame synchronization and carrier frequency offset estimation with a high accuracy can be achieved, and the packet loss rate can be reduced.

An embodiment of the present invention also includes a method of generating a training sequence for joint time synchronization and carrier frequency offset estimation in a wireless communication system, which is capable of performing time synchronization and carrier frequency offset acquisition simultaneously so as to achieve reliable frame synchronization and carrier frequency offset estimation with a high accuracy and to reduce the packet loss rate.

In one embodiment of the present invention, a method for performing joint time synchronization and carrier frequency offset estimation in a wireless communication system is provided. The method comprises: on a transmitting side: performing frequency domain spreading and interleaving on input data by using a predetermined spreading factor (SF) to generate a frequency domain training symbol; performing Inverse Discrete Fourier Transformation (IDFT) on the generated frequency domain training symbol to generate a first time domain training symbol; reversely copying the generated first time domain training symbol to a second time domain training symbol such that a complete central-symmetric comb-shaped training sequence is formed; and on a receiving side: detecting the power of received signals to judge the coming of the training sequence, and performing coarse frame synchronization on the received training sequence; performing joint fine frame synchronization and carrier frequency offset estimation based on the received training sequence; and compensating for the carrier frequency offset based on the carrier frequency offset estimation result to eliminate the carrier frequency offset.

In another embodiment of the present invention, an apparatus for performing joint time synchronization and carrier frequency offset estimation in a wireless communication system is provided. The apparatus comprises: a transmitter including a variable spreading factor (SF) control unit to set a variable spreading factor; a frequency domain spreading and interleaving unit to perform spreading and interleaving on input data in frequency domain by using the spreading factor (SF) to generate a frequency domain training symbol; an Inverse Discrete Fourier Transformation unit to transform the frequency domain training symbol to generate a first time domain training symbol; a symbol reverse repetition unit to reverse copying the generated first training symbol to a second time domain training symbol such that a central-symmetric comb-shaped training sequence is formed; a receiver including a power detection and coarse frame synchronization unit to detect the power of received data and performing coarse frame synchronization on the received data when the training sequence is detected; a joint fine frame synchronization and carrier frequency offset estimation unit to perform joint fine frame synchronization and carrier frequency offset estimation based on the received training sequence.

In a further embodiment of the present invention, a method of generating a training sequence for joint time synchronization and carrier frequency offset estimation in a wireless communication system is provided. The method comprises steps of: generating a spreading factor (SF); spreading and interleaving selected complex points in a constellation to generate a frequency domain training symbol; performing IDFT on the generated frequency domain training symbol to generate a first time domain training symbol; and reversely repeating the generated first time domain training symbol to a second time domain training symbol such that a central-symmetric comb-shaped training sequence is formed.

BRIEF DESCRIPTION OF THE DRAWINGS

The above and other embodiments, features and advantages of the present invention will be more apparent from following detailed description about the non-limited embodiments of the present invention taken in conjunction with the accompanied drawings, in which.

DETAILED DESCRIPTION

The embodiments of the present invention will be described in detail with reference to the drawings in the following. Those details and functions which are not essential to the present invention are omitted when they may make the present invention ambiguous.

Figure 1:
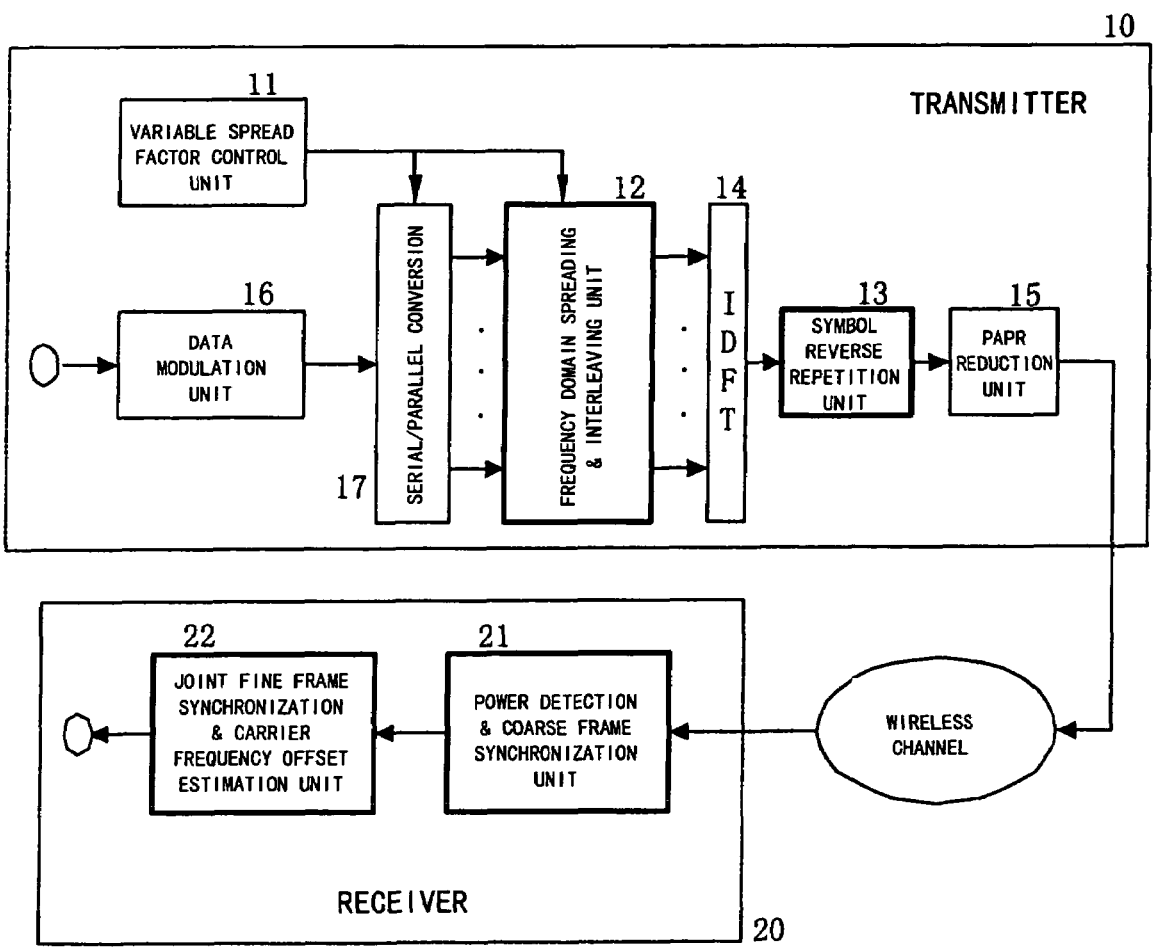
FIG. 1 is a block diagram showing an orthogonal frequency division multiplexing transmitter and receiver according to an embodiment of the present invention.

FIG. 1 is a block diagram showing an orthogonal frequency division multiplexing transmitter and receiver according to an embodiment of the present invention. As shown in FIG. 1, the transmitter 10 includes a variable spread factor control unit 11, a frequency domain spreading and interleaving unit 12, a symbol reverse repetition unit 13, an Inverse Discrete Fourier Transformation (IDFT) unit 14, a Peak Average Power Ratio (PAPR) reduction unit 15, a data modulation unit 16, and a serial/parallel conversion unit 17. The receiver 20 includes a power detection and coarse frame synchronization unit 21 and a joint fine frame synchronization and carrier frequency offset estimation unit 22.

On the transmitter side, the data is modulated by the data modulation unit 16. The modulated signals are provided to the serial/parallel conversion unit 17. In addition, the variable spread factor control unit 11 is provided in the transmitter for setting a variable spreading factor (SF). The spreading factor SF is a parameter previously set by the system based on current channel conditions, and is typically set to the n power of 2 ($2^n$) such as 2, 4, 8 and 16. As an example, the variable spread factor control unit 11 may be integrated in the transmitter, and has a good compatibility and thus can apply existing software and hardware modules. When the spreading factor is set, the variable spread factor control unit 11 will generate a determined spreading factor and provide it to the serial/parallel conversion unit 17 and the frequency domain spreading and interleaving unit 12. The modulated data is serial/parallel converted in the serial/parallel conversion unit 17. The converted data is output to the frequency domain spreading and interleaving unit 12. The frequency domain spreading and interleaving unit 12 performs spreading and interleaving in frequency domain on the input data by using the spreading factor. The spread and interleaved data is input into the Inverse Discrete Fourier Transformation (IDFT) unit 14. IDFT unit 14 performs Inverse Discrete Fourier Transformation on frequency domain training symbols and thus transforms data in frequency domain into data in time domain. That is, the frequency domain training symbols are converted into time domain training symbols after it passes thought the IDFT unit 14.

For simplifying the description, both the time synchronization and frequency synchronization in one embodiment of the algorithm of one embodiment of the present invention is implemented with the aid of a time frequency training sequence, for example. That is, the receiver detects only signals in time domain. It should be noted that the present invention is not limited thereto and its principle can also be applied to frequency domain.

The IDFT transformed data is repeated in reverse order at the symbol reverse repetition unit 13 in order to generate a central-symmetric comb-shaped training sequence. Before the data is transmitted, it is sent to the Peak Average Power Ratio (PAPR) reduction unit 15 so as to reduce the Peak Average Power Ratio (PAPR) of the data. Actually, the Peak Average Power Ratio (PAPR) reduction unit 15 is used to reduce a very large transmitting power either for performing adaptations or to be used by other algorithms. The contents related to the Peak Average Power Ratio (PAPR) reduction do not belong to the idea of the present invention and thus the detailed description thereof is omitted herein. Thereafter, the processed data is transmitted to the receiver via the wireless channels. As detailed explanation hereinafter, the synchronization detection is actually changed into a success rate detection due to the generation of the central-symmetric comb-shaped training sequence.

At the receiver 20, the power detection and coarse frame synchronization unit 21 detects the power of the received signals, and executes the coarse frame synchronization (time synchronization) when the transmitted training sequence is detected. According to the training sequence of the present invention, it can be known that a training sequence or a header of a frame is detected when the central-symmetric comb-shaped training sequence is detected. Up to this point, it cannot be confirmed which sample is the first sample and which part is the beginning of the frame since many samples are probably detected. Therefore, it is necessary to send the coarse frame synchronized signals to the joint fine frame synchronization and carrier frequency offset estimation unit 22. In the joint fine frame synchronization and carrier frequency offset estimation unit 22, the position of the synchronization detection window is adjusted to find which sample is the beginning of the frame. The fine frame synchronization and carrier frequency offset acquisition can be achieved with the aid of this received training sequence.

Figure 2:
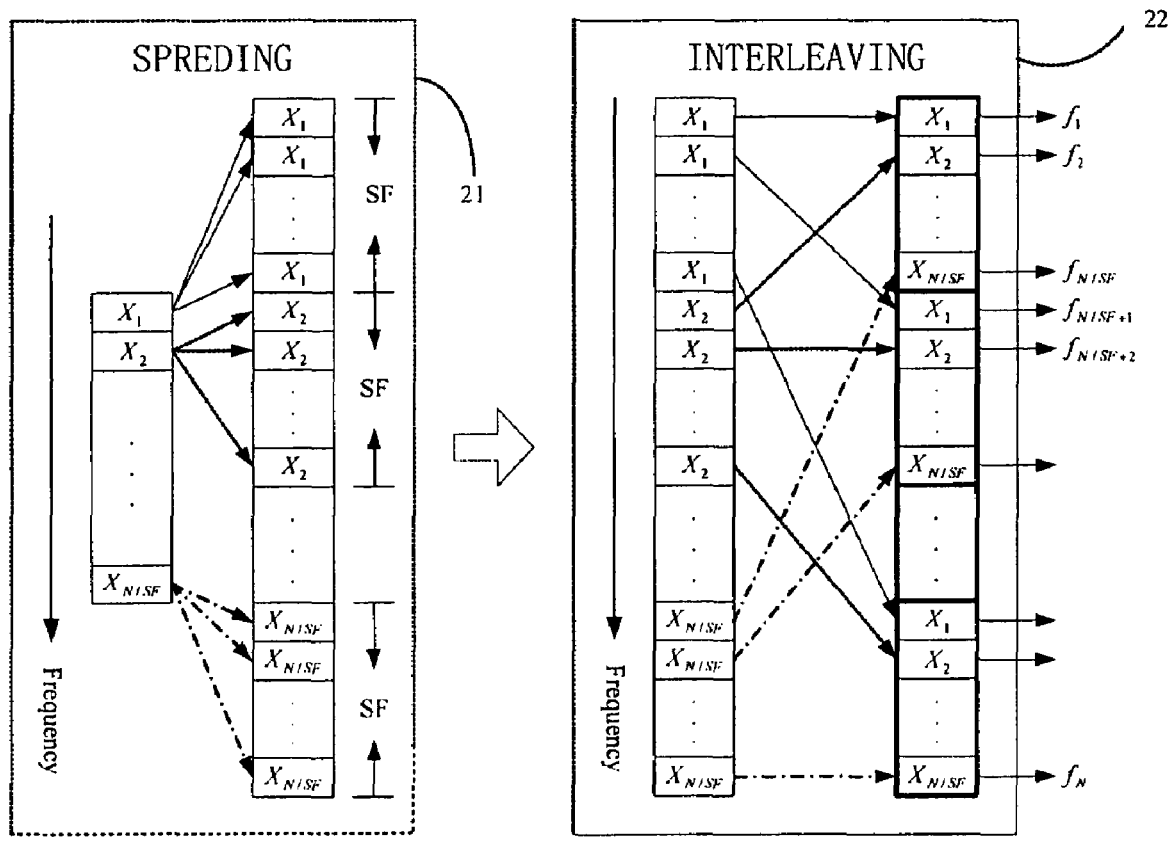
FIG. 2 is a schematic diagram showing a procedure for generating frequency domain training symbols according to the embodiment of the present invention, which includes spreading and interleaving.

Next, the processing of generating the frequency domain training sequence will be described with reference to FIG. 2. The left portion of FIG. 2 shows the spreading processing, and the right portion shows the interleaving processing. Before spreading, the transmitter has already determined the IDFT length and the spreading factor (SF). First of all, the modulator randomly selects N/SF complex points from a chosen constellation (for example, QPSK, QAM), wherein N is the IDFT length. Assuming that the selected N/SF complex points are $X_1, X_2, \ldots, X_{N/SF}$ and thus form a small modulation data block. As shown in the left portion of FIG. 2, the data sequence is spread after the data is selected. The spreading processing is as follows: each of the selected complex points in the constellation is repeated SF times to form a new sequence, $X_1, X_1, \ldots, X_1, X_2, X_2, \ldots, X_2, \ldots,$ and $X_{N/SF}$ $X_{N/SF}, \ldots, X_{N/SF}$, N segments of data in total, and each segment of data is used for modulating a sub-carrier. Next, the spread sequence is interleaved. The interleaving processing is shown in the right portion of FIG. 2: the N positions in frequency domain are equally divided into SF blocks each including N/SF frequency domain points, the same data among the data generated in the frequency domain is placed on the same positions in respective blocks, and the order of the respective modulation data in respective blocks is $X_1, X_2, \ldots, X_{N/SF}$. Thus, the interleaved frequency domain training symbols are $X_1, X_2, \ldots, X_{N/SF}, X_1, X_2, \ldots, X_{N/SF}, \ldots X_1, X_2, \ldots, X_{N/SF}$. That is, it is a result obtained by repeating the modulated data block before the spreading for SF times.

Figure 3A:
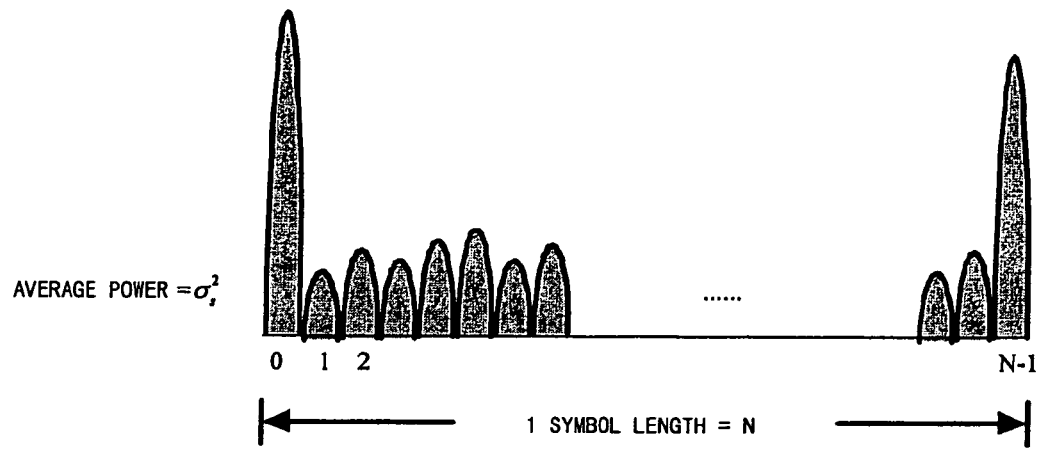
FIGS. 3A and 3B are respectively showing training symbols output from IDFT by using a conventional algorithm and the algorithm of one embodiment of the present invention, that is, a comparative diagram of time domain training symbols.
Figure 3B:
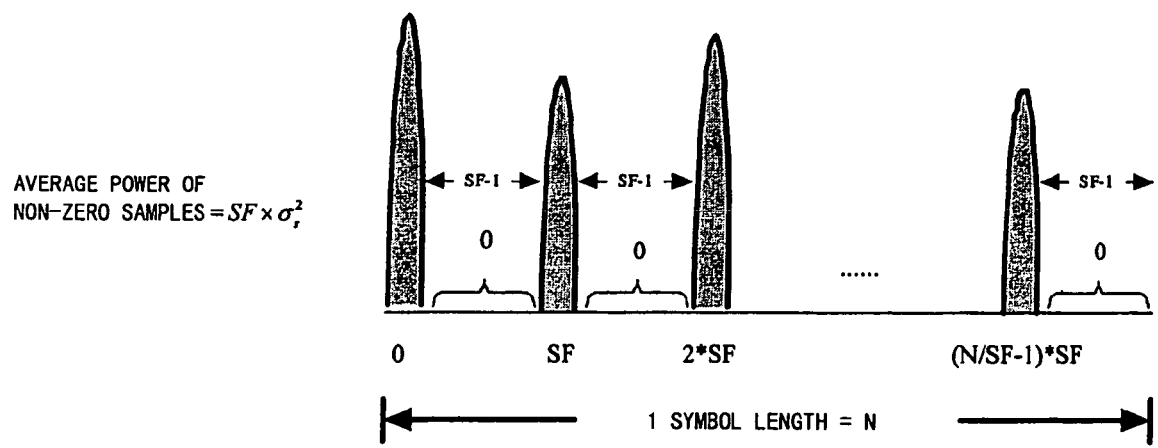

FIGS. 3A and 3B show training symbols output from IDFT unit by using a conventional algorithm and the algorithm of the present invention respectively, i.e., comparative diagrams of time domain training symbols. FIG. 3A shows the output characteristics of the time domain synchronization symbols used in the conventional OFDM synchronization algorithm, i.e., a result output after performing the IDFT transformation on the frequency domain training symbols. When the IDFT length and the power of the training sequence is unchanged, each time domain output sample of the conventional algorithm is non-zero but PAPR is high, and most of the output data have a low power. FIG. 3B is a schematic diagram showing the training symbols generated in the present invention. As shown in FIG. 3A, each sample of the conventional training sequence is not a zero, since the total energy of the conventional training sequence is fixed, the average height thereof is lower. If the signal-to-nose ratio (SNR) of the conventional training sequence is low, some signals included therein might probably not be detected. FIG. 3B shows the time domain output result after performing IDFT transformation on the interleaved frequency domain training symbols in accordance with one embodiment of the algorithm of one embodiment of the present invention. Since the frequency domain interleaved training symbols used in the algorithm of the present invention have periodicity, the IDFT transformed time domain training symbols have obvious time domain periodicity and a central-symmetric comb-shaped structure. That is, the $0^{th}$, $SF^{th}$, $2*SF^{th}, \ldots, (N/SF-1)*SF^{th}$ samples are non-zero, and all of the remaining outputs are zero. There are SF-1 zero samples between any two adjacent non-zero samples. The average power of the non-zero output data in these symbols is larger than that of the low power output samples in the conventional training symbols. Comparatively, with the condition which the total transmitted power of the training symbols is constant, such a central-symmetric comb-shaped training symbols generated according to the algorithm of the present invention can be considered as the energy originally owned by the zero samples in all the training symbols being superposed onto these non-zero samples. It is therefore more easily to detect the power of these non-zero samples and the packet loss ratio is therefore reduced.

Figure 4:
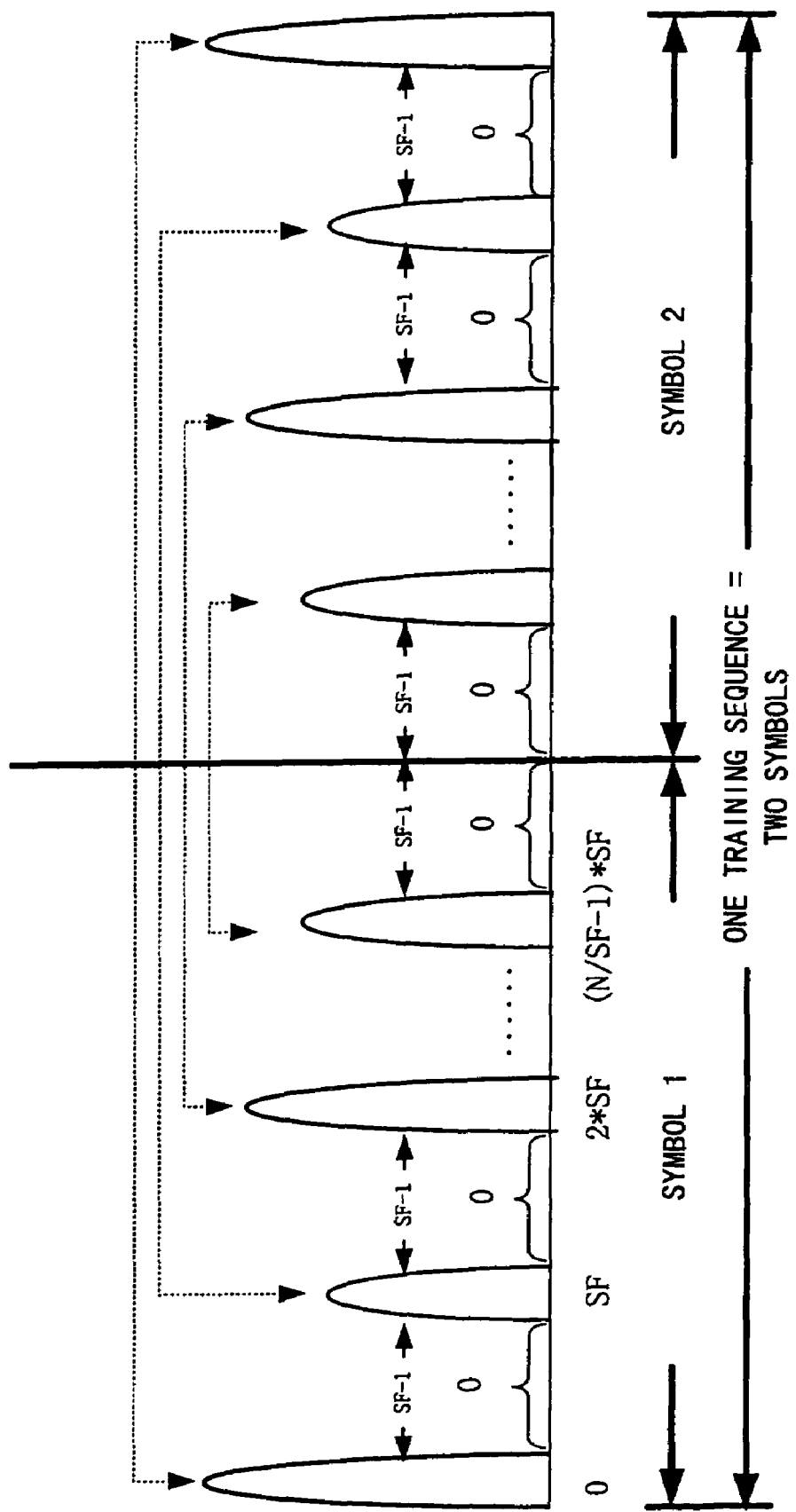
FIG. 4 is a schematic diagram showing a complete time domain training sequence by copying a first time domain symbols to a second time domain symbols in reverse order such that a complete central-symmetric comb-shaped training sequence is formed.

FIG. 4 is a schematic diagram showing one complete time domain training sequence by copying a first time domain symbols to a second symbols in reverse order. In FIG. 4, the processing for generating the central-symmetric comb-shaped training sequence is as follows. After the first comb-shaped time domain training symbols are generated, the second training symbols are a repetition of the first training symbols in reverse order. In other words, the first sample of the second training symbols is the $N^{th}$ sample of the first training symbols, the second sample of the second training symbols is the $N-1^{th}$ sample of the first training symbols, . . . , and the $N^{th}$ sample of the second training symbols is the first sample of the first training symbols. Each training sequence includes two time domain training symbols, and thus has a total length of 2N, and the structural characteristics is both comb-shaped and central symmetry. This structural characteristics can achieve excellent effects in the processing of power detection and joint time domain synchronization.

Figure 5:
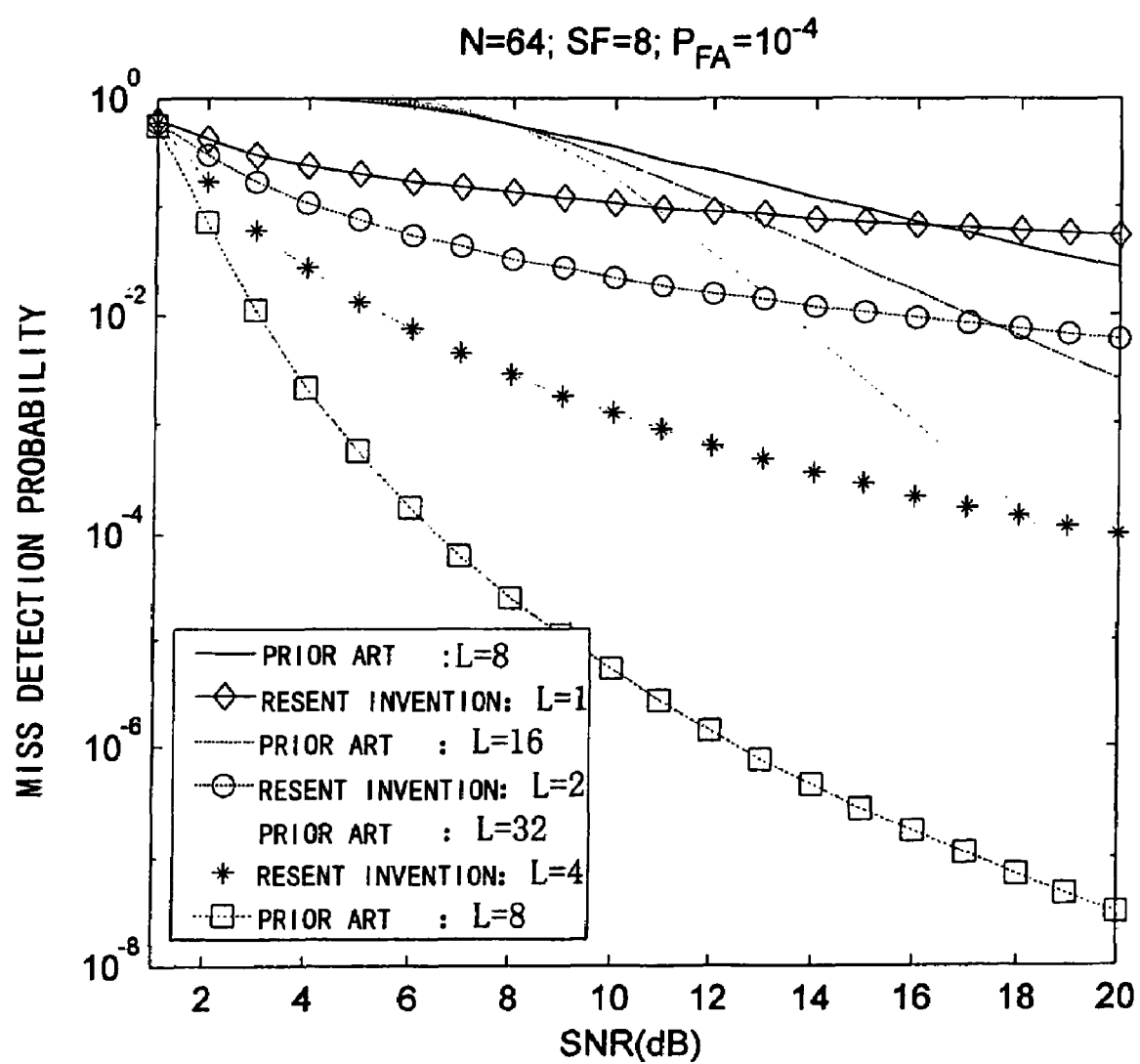
FIG. 5 is a graph showing the comparison of the miss detection probabilities of the conventional algorithm with the algorithm of the present invention.

FIG. 5 is a graph showing the comparison of the miss detection probabilities of the conventional algorithm with one embodiment of the algorithm of one embodiment of the present invention. As an example, the conventional algorithm and the algorithm of the present invention are compared under the assumption of the IDFT length N=64, false alarm probability $P_{FA}=10^{-4}$ and SF=8. For more comparable, an identical detection time is set to both algorithms. As shown in FIG. 5, for example, if 8 samples are contained during the detection time with respect to the conventional algorithm, then L=8. However, only 1 non-zero sample is contained during the same time with respect to the algorithm of the present invention, i.e., L=1. If 16 samples are contained during the detection time with respect to the conventional algorithm, then L=16. Only 2 non-zero samples are contained during the same time with respect to the algorithm, i.e., L=2.

If 32 samples are contained during the detection time respect to the conventional algorithm, then L=32. Only 4 non-zero samples are contained during the same time with respect to one embodiment of the algorithm of one embodiment of the present invention, i.e., L=4. It can be seen from above comparison on performance, the detection performance of the algorithm of the present invention is remarkably superior to the conventional algorithm in a low signal-to-nose ratio condition. For instance, the performance of the comparative conventional algorithm with L=16 corresponds to that of the algorithm of the present invention with L=2. When the signal-to-nose ratio is less than 17 dB, the miss detection probability of one embodiment of the algorithm of one embodiment of the present invention is less than that of the conventional algorithm.

Figure 6:
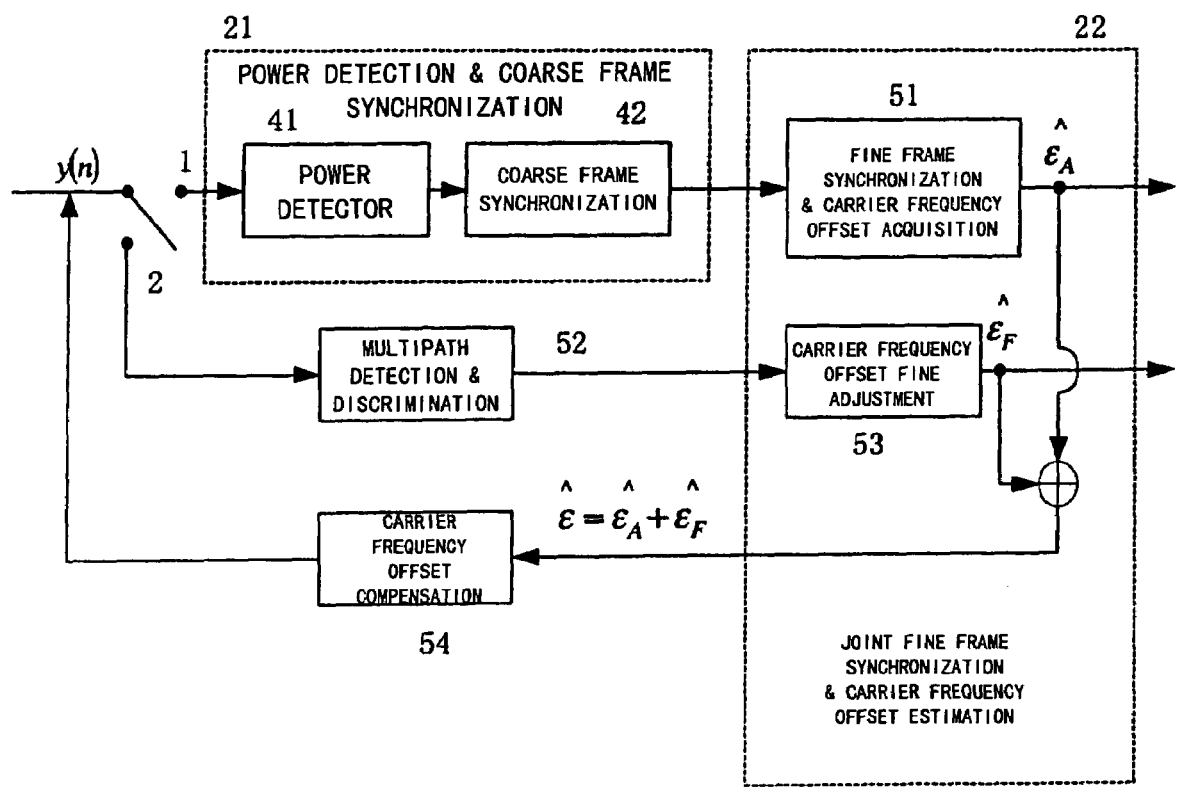
FIG. 6 is a block diagram showing the configuration of the receiver according to the embodiment of the present invention.

FIG. 6 is a block diagram showing the configuration of the receiver according to the embodiment of the present invention. As shown in FIG. 6, the receiver comprises a power detection and coarse frame synchronization unit 21, a joint fine frame synchronization and carrier frequency offset estimation unit 22, a multi-path signal detection and discrimination unit 52 and a carrier frequency offset compensation unit 54. The power detection and coarse frame synchronization unit 21 includes a power detection unit 41 and a coarse frame synchronization unit 42. The joint fine frame synchronization and carrier frequency offset estimation unit 22 includes a joint fine frame synchronization and carrier frequency offset acquisition unit 51 and a carrier frequency offset fine adjustment unit 53.

Since the training sequence generated by one embodiment of the algorithm of one embodiment of the present invention is of the central-symmetric comb-shaped training sequence, the detection of time synchronization thereof can be changed into the detection of success rate. Hence, at the receiver, when it detects one or more large power samples and these samples are arranged in a central-symmetric comb-shaped training sequence, it is assumed that a frame is coming. First of all, the receiver sets the values of the parameters $P_{FA}$, $\hat{\epsilon}_A$ and L, wherein $\Gamma$ represents a threshold set for the power detection and is adjustable dependent on the requirements of the system. The power detection unit 41 detects a series of received samples y(1), y(2), ..., y(N), and determines whether the value of $$\Omega(n, L) = \sum_{m=0}^{L-1} |y(n + m \times SF)|^2$$

is larger than a threshold $L \times \Gamma$. If so, it means that a frame is coming and is successfully detected. Otherwise, it is assumed that no frame is in coming. Since the training sequence used in the algorithm of the present invention has a sparse comb-shape, it is possible that the power detection algorithm is capable of performing the coarse frame synchronization in the coarse frame synchronization unit 42 and performing detection simultaneously the reason is that the synchronization error most possibly occurs at the positions of integer multiple samples of SF.

The coarse frame synchronized data is provided to the joint fine frame synchronization and carrier frequency offset acquisition unit 51. After all the 2N samples of the frame are detected, the joint fine frame synchronization and carrier frequency offset acquisition unit 51 can perform joint fine frame synchronization and carrier frequency offset estimation with the algorithm of the present invention. The implementation of the joint algorithm depends on the central-symmetric comb-shaped training sequence used in the algorithm of the present invention. The joint fine frame synchronization and carrier frequency offset acquisition unit 51 may operate following Equation (1) as an estimator.

$$\Phi_i(\hat{\epsilon}) = \left| \sum_{n=0}^{N/SF-1} y(i + 2N - 1 - n \cdot SF) \cdot y^*(i + n \cdot SF) \cdot e^{\frac{j4\pi n \hat{\epsilon} \cdot SF}{N}} \right|^2 \quad (1)$$

The above estimator means that if the time synchronization error and the carrier frequency offset as well as the influence of the noises are not taken into account, then y(i+2N−1−n*SF) and y(i+n*SF) should be the same. Even if the carrier frequency offset occurs, these two received samples should be statistically related to each other. The carrier frequency offset compensation unit 54 can compensate for the carrier frequency offset by using a product obtained by conjugatively multiplying each pair of correlated samples by $$e^{\frac{j4\pi n \hat{\epsilon} \cdot SF}{N}}.$$

If y(i) is just the first sample of the received training sequence and $\hat{\epsilon}$ is identical with the carrier frequency offset in the system, $\Phi_i(\hat{\epsilon})^2$ will get its maximum value which is expressed by Equation (2) as follow.

$$\{\hat{\theta}; \hat{\epsilon}\} = \underset{\{i;\hat{\epsilon}\}}{\operatorname{argmax}} \{\Phi_i(\hat{\epsilon})\} \quad (2)$$

in which $\hat{\theta}$ represents an estimated time offset, $\hat{\epsilon}$ represents an estimated carrier frequency offset. During this procedure, the frame synchronization and carrier frequency offset acquisition is performed simultaneously.

Due to the precision of the aforementioned carrier frequency offset acquisition algorithm being limited, it is necessary for the remaining carrier frequency offset after the acquisition to be estimated and corrected by the carrier frequency offset fine adjustment unit 53. The algorithm performed by the carrier frequency offset fine adjustment unit 53 is as follows. According to the central-symmetric comb-shaped training sequence used in one embodiment of the algorithm of one embodiment of the present invention, the logarithmic function of the probability density function of the received training sequence may be expressed by Equation (3) as follow.

$$\Lambda(\epsilon) = \log f(Y | \epsilon) = \log \left( \prod_{k=0}^{\frac{N}{SF}-1} f(y(k \cdot SF), y(2N - 1 - k \cdot SF)) \right) \quad (3)$$

in which $\epsilon$ represents the carrier frequency offset in the system. To obtain the maximum of $\Lambda(\epsilon)$, it is necessary to differentiate $\Lambda(\epsilon)$ with respect to $\epsilon$, and let the differentiated result is 0 so as to solve $\epsilon$ as expressed by Equation (4).

$$\hat{\varepsilon} = \frac{N \sum_{k=0}^{\frac{N}{SF}-1} |y^*(k \cdot SF) \cdot y(2N-1-k \cdot SF)| \cdot (2N-1-2k \cdot SF) \cdot \arg\{y^*(k \cdot SF) \cdot y(2N-1-k \cdot SF)\}}{2\pi \cdot \sum_{k=0}^{\frac{N}{SF}-1} |y^*(k \cdot SF) \cdot y(2N-1-k \cdot SF)| \cdot (2N-1-2k \cdot SF)^2} \quad (4)$$

Equation (4) is a maximum likelihood estimation algorithm of the carrier frequency offset fine adjustment.

For multi-path signals, one path with the maximum power is enough when the power detection and carrier frequency offset acquisition are performed. However, for the carrier frequency offset fine adjustment unit 53, a large average power means a high estimation precision. Thus, in a multi-path channel, those detectable multi-path signals should be collected and used as much as possible in order to effectively improve the estimation precision of the carrier frequency offset. Because the detection and discrimination of the multi-path signals are not essential functional modules in the system, a switch can be used to switch the multi-path signal detection and discrimination unit 52.

The method of detecting the multi-path signals is the same as that of detecting the power of the first path. Also, a comparison is performed to determine whether the energy of that path is higher than the threshold $L \times \Gamma$. If so, it means that the signals in that path can be used. Otherwise, the signals in that path are too weak to be used, and can only be assumed as noises. Since the detection for power only effectively detects several paths with larger powers, and those signals with small power are always processed as noises. Therefore, in multi-path channels, the performance of one embodiment of the algorithm of one embodiment of the present invention is somewhat degraded as compared with the AWGN channels.

After the carrier frequency offset acquisition and fine estimation, the estimated carrier frequency offset $\hat{\epsilon} = \hat{\epsilon}_A + \hat{\epsilon}_F$ should compensate those subsequently received data symbols and training sequences for carrier frequency offsets wherein $\hat{\epsilon}_A$ represents a result of the carrier frequency offset acquisition, and $\hat{\epsilon}_F$ represents a result of the carrier frequency offset fine adjustment. The compensation method is to multiply the $n^{th}$ sample in the received sequence by $$e^{\frac{j2\pi n \hat{\epsilon}}{N}}.$$

Figure 7:
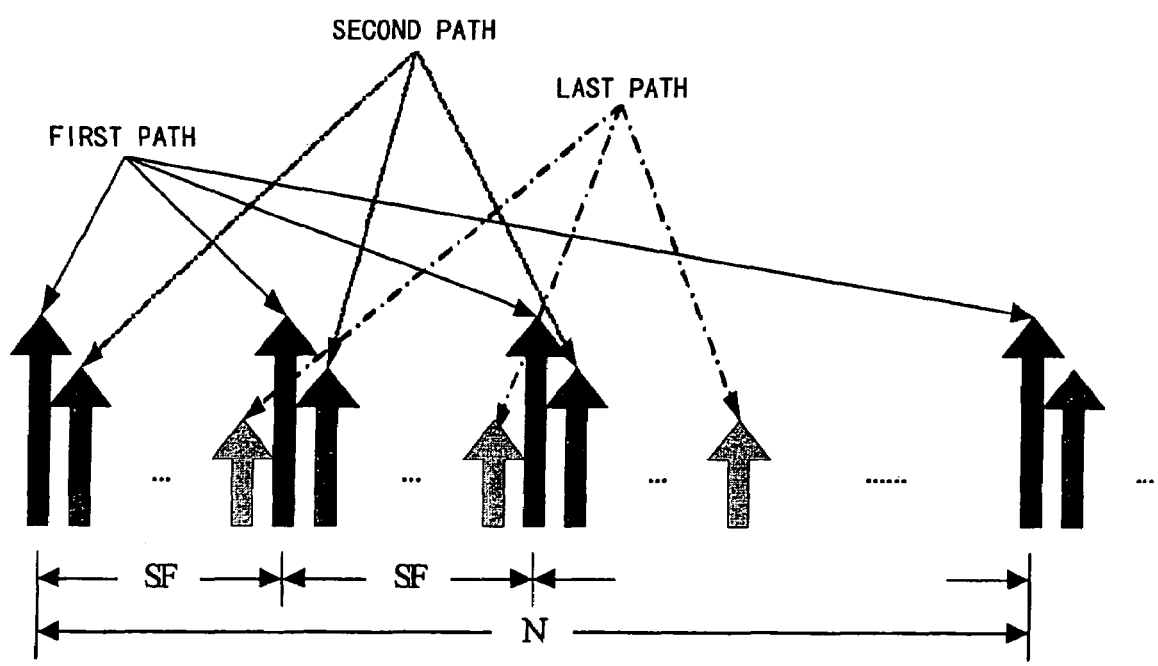
FIG. 7 is a schematic diagram showing the multi-path signal discrimination at the receiver according to the algorithm of the present invention.

FIG. 7 is a schematic diagram showing the multi-path discrimination at the receiver according to the algorithm of the present invention, which represents the detection and discrimination of the multi-path signals at the receiver. In FIG. 7, the discrimination of the multi-path signals is shown, for example, with three paths. The path with the largest amplitude is referred as the first path, the path with the second largest amplitude is referred as the second path, and the path with the smallest amplitude is referred as the third path. Since the average powers and delayed time periods of the multi-path signals are different from one another and the training sequence used in one embodiment of the algorithm of one embodiment of the present invention is of a sparse central-symmetric comb-shaped training sequence, the multi-path interference between respective paths is very small and thus the power detection and discrimination of the multi-path signals is very easy.

Figure 8:
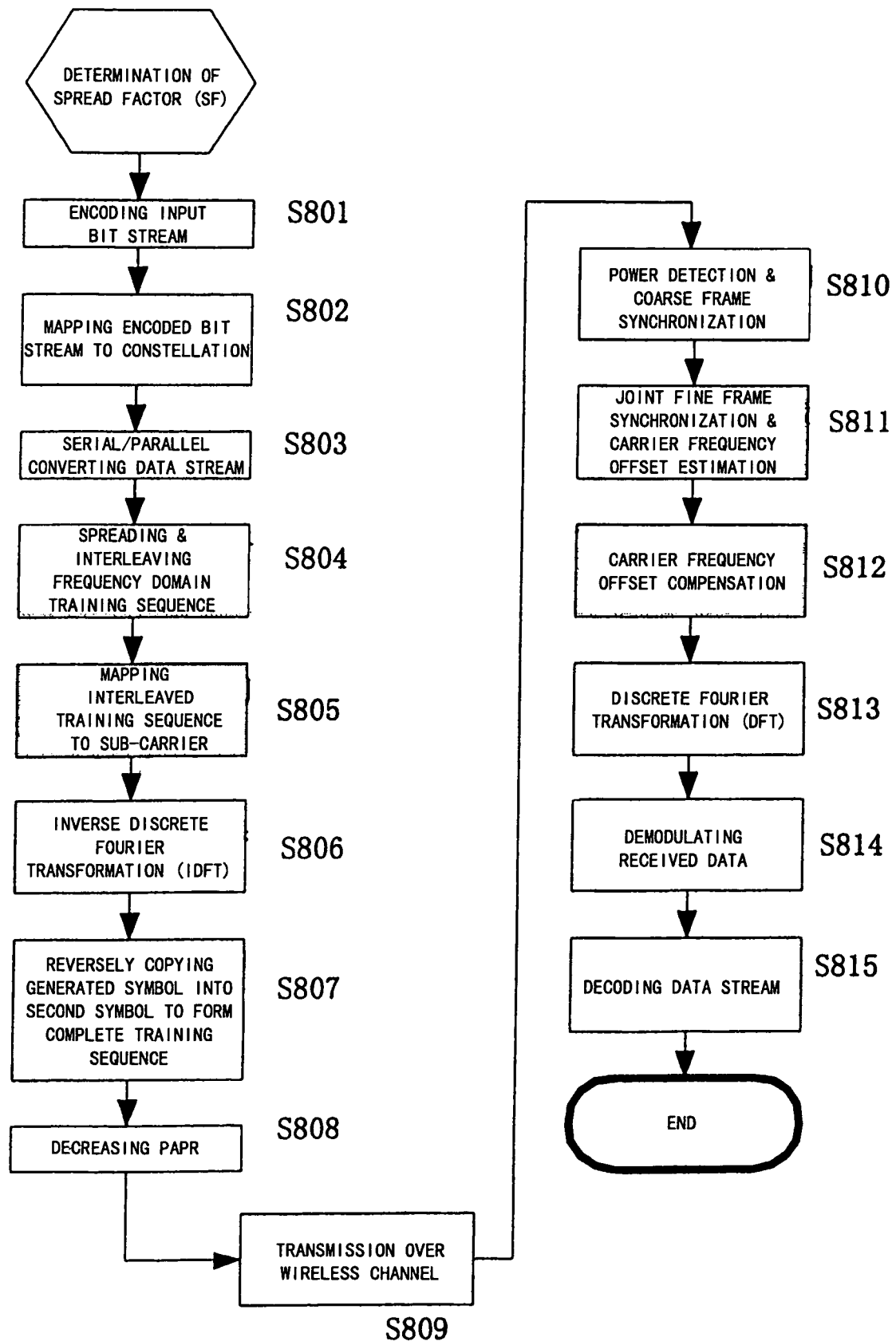
FIG. 8 is a flowchart showing a synchronization algorithm for multi-carrier modulation system according to the embodiment of the present invention.

FIG. 8 is a flowchart showing a synchronization algorithm for multi-carrier modulation system according to the embodiment of the present invention. Firstly, the variable spread factor control unit 11 generates the spreading factor (SF). In step S801, the input bit stream is encoded. In step S802, the encoded bit stream is mapped onto the constellation Thereafter, in step S803, the encoded bit stream is serial/parallel converted in the serial/parallel conversion unit 17. In step S804, the input data is spread and interleaved in frequency domain with the generated spreading factor. The signals input to the system related to the algorithm of one embodiment of the present invention are complex points on a certain constellation such as QPSK, 16QAM, 64QAM etc. After being spread, the frequency domain data is shown in the left portion of FIG. 2. If general data symbols are modulated, the Inverse Discrete Fourier Transformation (IDFT) is then carried out on the spread frequency domain symbols in step S806, and thereafter the signals pass through the PAPR reduction unit 15 to reduce the Peak Average Power Ratio of the transmitted signals, and then are transmitted via channels. If the system intends to generate training symbols, then after the data are spread in frequency domain at step S804, they further need to be interleaved. The interleaving processing is shown in the right portion of FIG. 2. In step S805, the interleaved frequency domain training symbols are mapped onto sub-carriers. Next, the Inverse Discrete Fourier Transformation (IDFT) is also performed in step S806. After the interleaved frequency domain data is IDFT transformed, the generated time domain training symbols are shown in FIG. 3B, which is of a comb-shaped structure. Next, in step S807, the generated time domain training symbols are copied to a second time domain training symbols to form a complete training sequence. In the resultant central-symmetric comb-shaped symbol, only the $0^{th}$, $SF^{th}$, $2*SF^{th}$, ..., $(N/SF-1)*SF^{th}$ samples are non-zero, and all of the remaining samples are zero. There are SF−1 zero samples between any two adjacent non-zero samples. With the condition which the remaining energy of the entire training symbols is a constant, the larger the SF is, the smaller the number of the non-zero values in the IDFT output data is, but the larger the average power of these non-zero output data is. The training sequence required in one embodiment of the algorithm of one embodiment of the present invention includes 2 training symbols, and the generation of the second time domain training symbols is to perform a reverse copy on the basis of the first time domain training symbols. In other words, the first sample of the second training symbols is the $N^{th}$ sample of the first training symbols, the second sample of the second training symbols is the $N-1^{th}$ sample of the first training symbols, ..., and the $N^{th}$ sample of the second training symbols is the first sample of the first training symbols. This training sequence has a central-symmetric comb shape as shown in FIG. 4. After the generation of the training sequence, in step S809, the data obtained after the Peak Average Power Ratio (PAPR) of the training sequence is reduced by the PAPR reduction unit 15 is transmitted via the wireless channels.

At the receiver, firstly, in step S810, the coming of a training sequence is detected by using the power detection and coarse frame synchronization unit 21. When a series of large power central-symmetric comb-shaped data samples are detected, the system assumes that a training sequence is coming, and the synchronization time of frame can be coarsely estimated using these detected large power central-symmetric comb-shaped data samples. A training sequence can be detected by using power detection. With the use of the central-symmetric comb-shaped training sequence used in one embodiment of the algorithm of one embodiment of the present invention, joint frame synchronization and carrier frequency offset estimation can be performed. Thereafter, in step S811, the joint fine frame synchronization and carrier frequency offset estimation unit 22 carries out the joint fine frame synchronization and carrier frequency offset estimation based on the coarsely synchronized data by using the central-symmetric comb-shaped training sequence according to the algorithm of the present invention. After the estimated carrier frequency offset is obtained, in step S812, the carrier frequency offset compensation unit 54 compensates for the frequency offset in order to eliminate the frequency offset. Next, in step S813, the Inverse Discrete Fourier Transformation (IDFT) is performed on the carrier frequency offset compensated data. Then, in step S814, the received compensated carrier frequency offset and IDFT transformed data are demodulated. Thereafter, the demodulated data is decoded so as to obtain original data.

Figure 9:
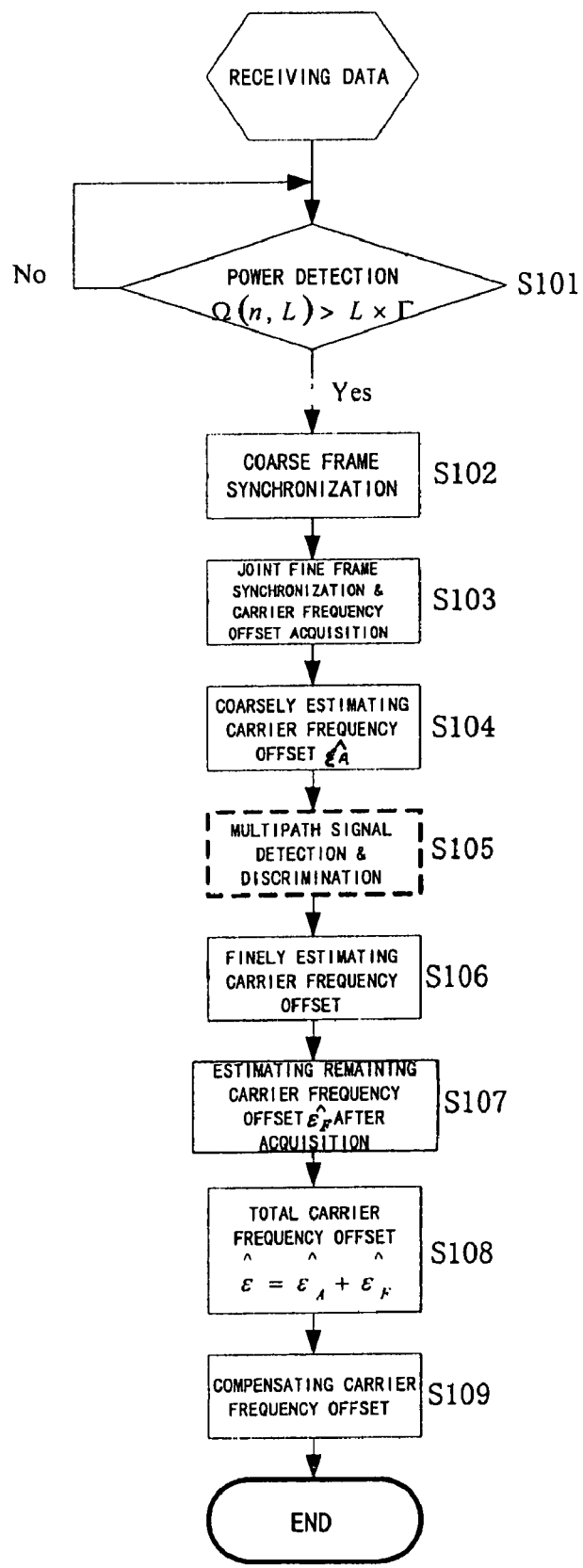
FIG. 9 is a flowchart showing the joint time synchronization and carrier frequency offset estimation according to the embodiment of the algorithm of the present invention.

Next, the flow of the joint time synchronization and carrier frequency offset estimation according to one embodiment of the algorithm of one embodiment of the present invention will be described with reference to FIG. 9. According to one embodiment of the algorithm of one embodiment of the present invention, the detection for time synchronization is changed into the detection for success ratio due to the central-symmetric comb-shaped training sequence. The joint synchronization procedure comprises power detection and coarse time synchronization. The joint frame synchronization and carrier frequency offset estimation comprises fine frame synchronization and carrier frequency offset acquisition, carrier frequency offset fine adjustment, multi-path signal detection and discrimination, and carrier frequency offset compensation. At the receiver, when it detects one or more large power samples and these samples are arranged in a central-symmetric comb shape, it assumes that a new frame is coming. The detection processing is as follows. First of all, the receiver sets the values of the parameters $P_{FA}$, $\hat{\epsilon}_A$ and L, wherein F represents a threshold set for the power detection and is adjustable depending on the requirements of the system. In step S101, for a series of received samples y(1), y(2), . . . , y(N), it is determined whether the value of $$\Omega(n, L) = \sum_{m=0}^{L-1} |y(n + m \times SF)|^2$$

is larger than the threshold L×Γ. If so, it means that a new frame is coming and is being successfully detected, and the processing goes to step S102. Otherwise, it assumes that no frame is coming. Since the training sequence used in one embodiment of the algorithm of one embodiment of the present invention is a sparse central-symmetric comb-shape training sequence it is possible that coarse frame synchronization and detection are carried out simultaneously with the power detection algorithm the reason is that the synchronization error most possibly occurs at the positions of integer multiple samples of SF.

Therefore, in step S102, the coarse frame synchronization can be performed immediately after the coming of the new frame is detected. After all of the 2N samples of the new frame are detected, in step S103, one embodiment of the algorithm of one embodiment of the present invention performs joint fine frame synchronization and carrier frequency offset esti-mation. The implementation of the joint algorithm depends on the central-symmetric comb-shape training sequence used in one embodiment of the algorithm of one embodiment of the present invention. The execution contents of the joint algorithm have already been described above and thus are omitted for simplicity. Then, in step S104, the joint fine frame synchronization and carrier frequency offset acquisition unit 51 coarsely estimate the carrier frequency offset $\hat{\epsilon}_A$. In a case where multi-path signals exist, the multi-path signal detection and discrimination unit 52 detects and discriminates the multi-path signal in step S105. For the carrier frequency offset fine adjustment algorithm, a large average power means the complex points on the constellation having a high estimation precision. Thus, in a multi-path channel, those detectable multi-path signals should be collected and used as much as possible in order to effectively improve the estimation precision of the carrier frequency offset. It should be noted that the detection and discrimination of the multi-path signals are not essential functional modules in the system. For multi-path signals, one path which has the maximum power is enough. The method of detecting the multi-path signals is same as that of detecting the power of the first path. That is, a comparison is performed to determine whether the energy of that path is higher than the threshold L×Γ. If so, it means that the signals in that path can be used. Otherwise, the signals in that path are too weak to be used, and can only be assumed as noises. After that, in step S106, the carrier frequency offset fine adjustment unit 53 performs the carrier frequency offset fine estimation, and the algorithm thereof is as shown by above Equation (3). Due to the precision of the aforementioned carrier frequency offset acquisition algorithm is limited, in step S107, the remaining carrier frequency offset $\hat{\epsilon}_F$ after the acquisition is estimated by the carrier frequency offset fine adjustment unit 53 by using the carrier frequency offset fine adjustment algorithm for the estimation and correction later. Thereafter, in step S108, after the carrier frequency offset acquisition and fine estimation, the estimated carrier frequency offset $\hat{\epsilon} = \hat{\epsilon}_A + \hat{\epsilon}_F$ is obtained, where $\hat{\epsilon}_A$ represents a result of the carrier frequency offset acquisition, and $\hat{\epsilon}_F$ represents a result of the carrier frequency offset fine adjustment. Then, in step S109, those subsequently received data symbols and training sequences are compensated for carrier frequency offsets. The compensation may be carried out by multiplying the $n^{th}$ sample in the received sequence by $$e^{\frac{j2\pi n\hat{\epsilon}}{N}}.$$

Figure 10:
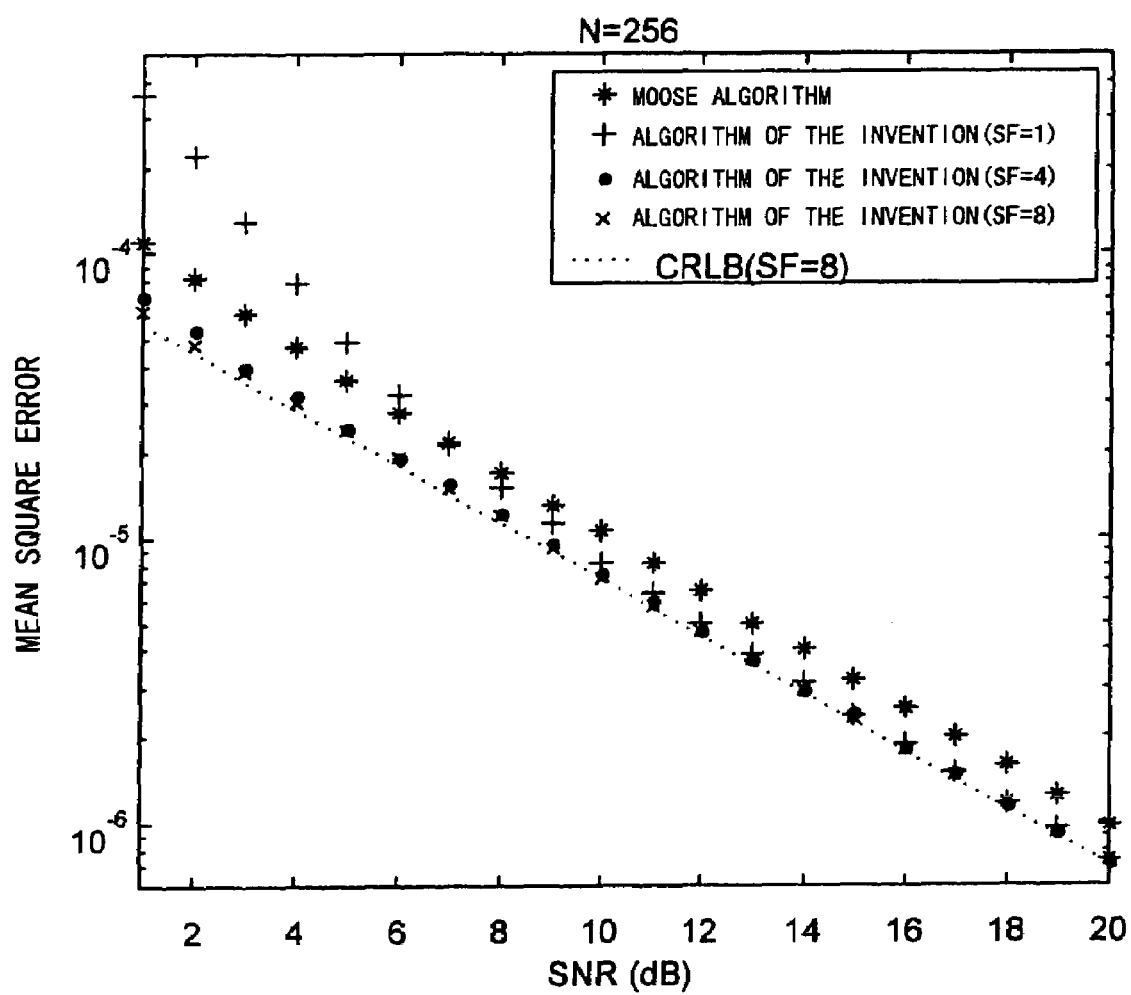
FIG. 10 is a graph showing the comparison of the accuracies of the carrier frequency offset estimation in an AWGN channel by using the conventional algorithm with the algorithm of the present invention.

FIG. 10 is a graph showing the results by comparing the carrier frequency offset estimation accuracy obtained by using the conventional algorithm with the accuracy obtained by using the algorithm of the present invention under the condition of an AWGN channel. In the present example, the Moose algorithm, which is commonly used in prior art, is compared with the algorithm of the present invention in terms of performance in an AWGN channel.

As shown in FIG. 10, herein, only the accuracy of the carrier frequency offset estimation is compared. In terms of the acquisition ranges of the carrier frequency offset estimation, the Moose algorithm can only estimate ±½ sub-carrier interval. As the increase of the acquisition range, the IDFT length has to be reduced, which results in degradation in estimation accuracy. The maximum acquisition range of the algorithm of the present invention is up to $$\pm \frac{N}{4 \cdot SF}.$$

When n is much larger than 4×SF, the algorithm of the present invention can acquire a carrier frequency offset which is much larger than one sub-carrier interval. In addition, in terms of estimation accuracy, for a determined IDFT length N, the Cramer-Rao Lower Bound (CRLB) of the estimation mean square error of the Moose algorithm is $$\mathrm{Var}\left\{\delta \middle| |\varepsilon| < \frac{1}{2}\right\} \geq \frac{1}{4\pi^2 \cdot N \cdot SNR};$$

whereas the CRLB of the algorithm of the present invention is $$\mathrm{Var}\left\{\delta \middle| |\varepsilon| < \frac{N}{2(2N-1)}; SF\right\} \geq \frac{3N}{4\pi^2 \cdot [2 \cdot SF^2 + (6N-6) \cdot SF + 4N^2 - 6N + 3] \cdot SNR}.$$

This CRLB is significantly improved as compared with the Moose algorithm. As shown in FIG. 10, when N=256, SF=8, the performance of the algorithm of the present invention is improved by 1.5 dB with respect to that of the Moose algorithm.

Figure 11:
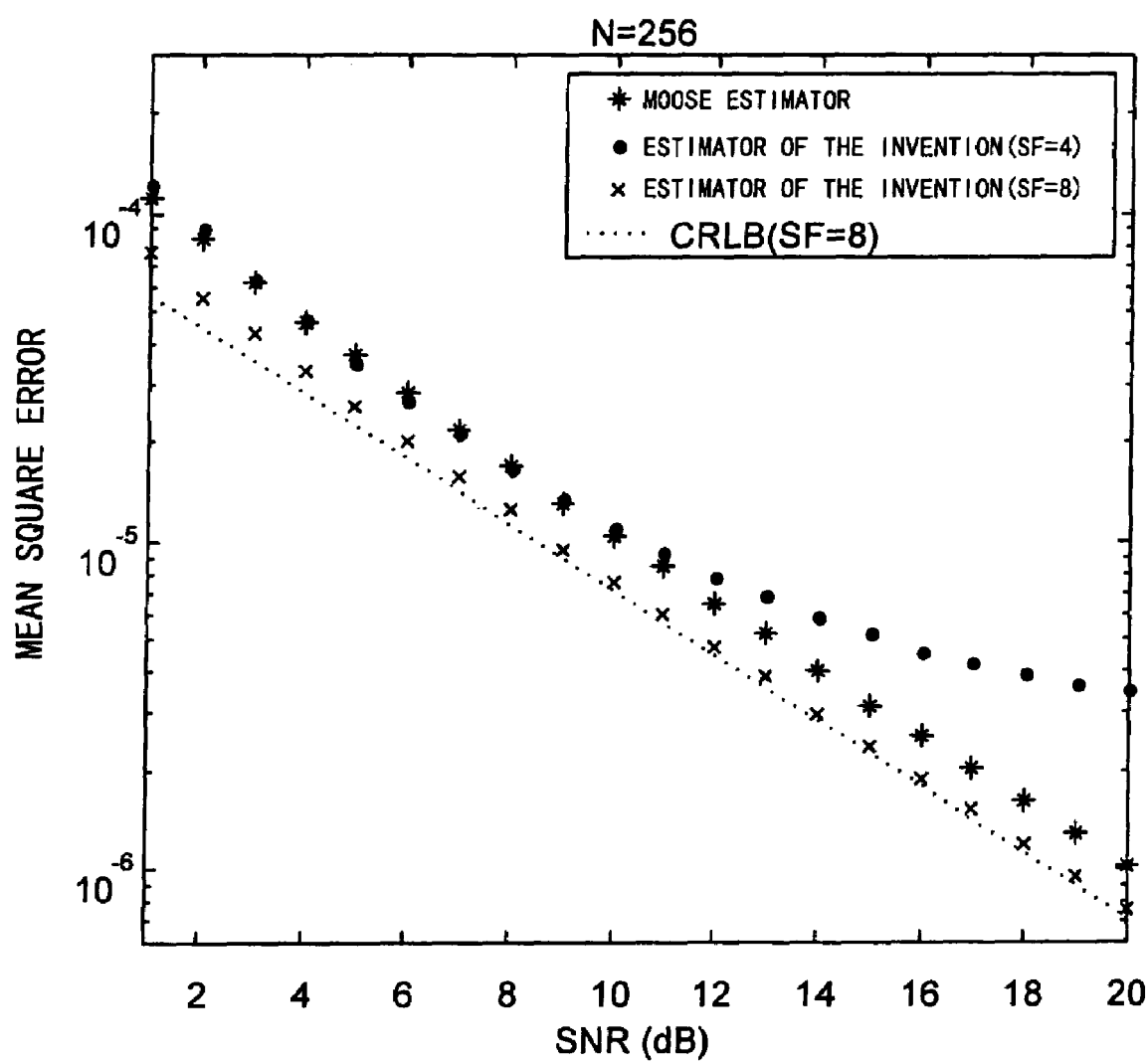
FIG. 11 is a graph showing the comparison of the accuracies of the carrier frequency offset estimation in a multi-path fading channel by using the conventional algorithm with the algorithm of the present invention.

FIG. 11 is a graph showing the results by comparing the estimation accuracy obtained by using the conventional algorithm such as the Moose algorithm with the estimation accuracy obtained by using the algorithm of the present invention under the condition of a multi-path channel. Because it is in a multi-path channel, those low power multi-path signals cannot be effectively detected and used. As compared with the AWGN channel, the estimation accuracy obtained by using the algorithm of the present invention in a multi-path channel is somewhat degraded. Meanwhile, the interference between respective multi-path signals may influence the estimation performance of the algorithm of the present invention. If the interval of the SF samples is larger than the maximum delay of the multi-path signals, the interference between the multi-path signals is zero, and thus the algorithm of the present invention will not have the floor effects under the condition of a high signal-to-noise ratio. FIG. 11 shows a Rayleigh channel with four independent paths, in a case where the delays of the four paths are 0, 2, 4 and 6 sample intervals respectively, the powers of the respective paths follow a negative exponential distribution when N=256. The SF can be 4 or 8. When SF=4, the algorithm of the present invention has floor effect since the interval of the SF samples is smaller than the maximum multi-path delay. When the SF is increased to 8, the floor effect disappears. Assuming that 3-path signals out of all the received 4-paths signals are effectively detected and used, the performance of the algorithm of the present invention is higher than that of the Moose algorithm by 1.2 dB.

According to above description in conjunction with the embodiments of the present invention, one embodiment of the algorithm of the present invention can provide a reliable power detection algorithm and achieve rapid and reliable frame synchronization as compared with the prior art. Further, the algorithm according to the present invention can increase the acquisition range of the carrier frequency offset.

In a multi-carrier modulation system, the amount of the carrier frequency offset can be up to an interval of several or tens of sub-carriers. In the conventional algorithms, such an estimation range of the carrier frequency offset is limited. Generally, the conventional carrier frequency offset estimation is in a range of ±0.5 interval of sub-carrier. For a carrier frequency offset in spreading, the problems of the conventional algorithm are the degradation in estimation accuracy or the need of additional symbols. For example, a sequence of frequency offset is used for acquisition, and another sequence of carrier frequency offset is used for fine adjustment. However, it will increase the overhead of the system.

The problem solved by one embodiment of the algorithm of the present invention is to increase the acquisition range without increasing the hardware overhead of the system and without degrading the estimation performance. Further, one embodiment of the algorithm of the present invention can improve the accuracy of the carrier frequency offset estimation.

Although the present invention is illustrated with reference to the preferred embodiments thereof, it can be understood by those skilled in the art that various changes and modifications to the present invention are possible without departing from the spirit and scope of the present invention.

What is claimed is:

1. A method for performing joint time synchronization and carrier frequency offset estimation in a wireless communication system, comprising:
   on a transmitting side:
      performing frequency domain spreading and interleaving on input data by using a predetermined spreading factor (SF) to generate a frequency domain multiple repetition training symbol;
      performing Inverse Discrete Fourier Transformation (IDFT) on the generated frequency domain multiple repetition training symbol to generate a first time domain comb shaped training symbol;
      reversely copying the generated first time domain comb shaped training symbol to a second time domain training symbol such that a complete central-symmetric comb-shaped training sequence is formed in the time domain; and
   on a receiving side:
      detecting an average power of received non-zero signals to judge the coming of the training sequence, and performing coarse frame synchronization;
      performing joint fine frame synchronization and carrier frequency offset estimation based on the received training sequence; and
      compensating for the carrier frequency offset based on the carrier frequency offset estimation result to eliminate the carrier frequency offset.

2. The method according to claim 1 further comprising encoding the input data stream and mapping the encoded data stream to a constellation.

3. The method according to any of claims 1 or 2, further comprising serial/parallel converting the encoded data stream.

4. The method according to claim 1, further comprising mapping the interleaved frequency domain multiple repetition training symbol to each sub-carrier.

5. The method according to claim 1, further comprising reducing the Peak Average Power Ratio (PAPR) of the signals to be transmitted.

6. The method according to claim 1, wherein detecting the average power of received signals comprises detecting the power of a series of received samples and determining whether the detected power is larger than a predetermined threshold or not.

7. The method according to claim 1, further comprising estimating a total carrier frequency offset and compensating for the total carrier frequency offset.

8. The method according to claim 7, wherein estimating the total carrier frequency offset comprises performing both the carrier frequency offset acquisition and fine estimation on the carrier frequency offset after the acquisition, and then summing the estimation results.

9. The method according to claim 1, further comprising discriminating and detecting multi-path signals and collecting the detected multi-path signals in a case where multi-path signals exist.

10. The method according to claim 7, further comprising performing Discrete Fourier Transformation (DFT) on the signals whose carrier frequency offset has been compensated for.

11. An apparatus for performing joint time synchronization and carrier frequency offset estimation in a wireless communication system, the apparatus comprising:
a transmitter including:
a variable spreading factor (SF) control unit to set a variable spreading factor;
a frequency domain spreading and interleaving unit to spread and interleaving input data in frequency domain by using the spreading factor (SF) to generate a frequency domain multiple repetition training symbol;
an Inverse Discrete Fourier Transformation unit to transform the frequency domain multiple repetition training symbol to generate a first time domain comb shaped training symbol;
a symbol reverse repetition unit to reverse copying the generated first time domain comb shaped training symbol to a second time domain training symbol such that a central-symmetric comb-shaped training sequence is formed in the time domain;
a receiver including:
a power detection and coarse frame synchronization unit to detect the power of received non-zero samples and performing coarse frame synchronization on the received non-zero samples when the training sequence is detected;
a joint fine frame synchronization and carrier frequency offset estimation unit to perform joint fine frame synchronization and carrier frequency offset estimation on the received data based on the received training sequence.

12. The apparatus for performing joint time synchronization and carrier frequency offset estimation in a wireless communication system according to claim 11, wherein the transmitter further comprises a serial/parallel conversion unit to perform serial/parallel conversion complex points on a constellation.

13. The apparatus for performing joint time synchronization and carrier frequency offset estimation in a wireless communication system according to claim 11, wherein the transmitter further comprises a Peak Average Power Ratio (PAPR) reduction unit to reduce PAPR of the data.

14. The apparatus for performing joint time synchronization and carrier frequency offset estimation in a wireless communication system according to claim 11, wherein the power detection and coarse frame synchronization means comprises a power detection unit to detect the average power of a series of received signals to determine whether the detected power is larger than a predetermined threshold or not, and a coarse frame synchronization unit to perform coarse frame synchronization based on the detected signals.

15. The apparatus for performing joint time synchronization and carrier frequency offset estimation in a wireless communication system according to claim 11, wherein the joint fine frame synchronization and carrier frequency offset estimation unit comprises a fine frame synchronization and frequency offset acquisition unit to perform joint fine frame synchronization and carrier frequency offset estimation.

16. The apparatus for performing joint time synchronization and carrier frequency offset estimation in a wireless communication system according to claim 11 wherein the receiver further comprises a multi-path detection and discrimination unit to discriminate multi-path signals and detecting the power of the multi-path signals.

17. The apparatus for performing joint time synchronization and carrier frequency offset estimation in a wireless communication system according to claim 11, wherein the joint fine frame synchronization and carrier frequency offset estimation unit comprises a carrier frequency offset fine adjustment unit to estimate and correct the remaining carrier frequency offset after the carrier frequency offset acquisition.

18. The apparatus for performing joint time synchronization and carrier frequency offset estimation in a wireless communication system according to claim 11 wherein the receiver comprises a carrier frequency offset compensation unit to compensate for the carrier frequency offset based on the estimated carrier frequency offset.

19. A method of generating a training sequence for joint time synchronization and carrier frequency offset estimation in a wireless communication system, comprising:
generating a spreading factor (SF);
spreading and interleaving selected complex points on a constellation to generate a frequency domain multiple repetition training symbol;
performing Inverse Discrete Fourier Transformation (IDFT) on the generated frequency domain multiple repetition training symbol to obtain a first time domain comb shaped training symbol; and
reversely repeating the generated first time domain comb shaped training symbol to a second time domain training symbol such that a central-symmetric comb-shaped training sequence is formed in the time domain.

20. The method according to claim 19, wherein the spreading and interleaving step comprising repeating the selected complex points on the constellation for SF times (where SF is the n power of 2 and n is an integer) to form complete frequency domain multiple repetition training symbol.

21. The method according to claim 19, wherein there are SF−1 zero samples between any two adjacent non-zero samples with respect to the generated time domain comb shaped training symbol.

* * * * *